United States Patent

[11] 3,601,713

[72] Inventors Peter R. Solomon
West Hartford;
Melvin P. Shaw, West Hartford; Harold L. Grubin, Bloomfield, all of, Conn.

[21] Appl. No. 797,055
[22] Filed Feb. 6, 1969
[45] Patented Aug. 24, 1971
[73] Assignee United Aircraft Corporation
East Hartford, Conn.

[54] SHAPED BULK NEGATIVE-RESISTANCE DEVICE OSCILLATORS AND AMPLIFIERS
13 Claims, 21 Drawing Figs.

[52] U.S. Cl. 331/107 G, 317/234 V
[51] Int. Cl. H03b 7/14
[50] Field of Search 331/107 G; 317/234.10

[56] References Cited

UNITED STATES PATENTS 3,365,583 1/1968 Gunn 331/107 X
3,377,566 4/1968 Lanza 331/107
3,467,896 9/1969 Kroemer 331/107 X

OTHER REFERENCES

Copeland, IEEE Transactions on Electron Devices, Vol. ED-14, September 1967, pp. 55–58. (331-107G)
Guetin, IEEE Transactions on Electron Devices, Vol. ED-14, September 1967, pp. 552–562. (331-107G)

*Primary Examiner*—Roy Lake
*Assistant Examiner*—Siegfried H. Grimm
*Attorney*—Donald F. Bradley

ABSTRACT: A class of active solid state oscillators and amplifiers in which an active working substance, typically a semiconductor such as gallium arsenide, is connected between two low-resistance contacts. The working substance is shaped or sculptured in a manner to alter the electric field distribution in the working substance and to maintain the active region of the device away from the controlling electric fields of the contacts.

INVENTORS
PETER R. SOLOMON
MELVIN P. SHAW
HAROLD L. GRUBIN

BY Donald J. Bradley
ATTORNEY

SHAPED BULK NEGATIVE-RESISTANCE DEVICE OSCILLATORS AND AMPLIFIERS

BACKGROUND OF THE INVENTION

1. Field of the Invention

This invention relates to active solid state devices, and in particular to a class of novel solid state oscillators and amplifiers which produce AC oscillations when a DC or pulsating DC electric field is applied thereto. A unique feature of the device is that the working substance, typically a two-valley semiconductor such as gallium arsenide, is shaped or sculptured in such a fashion that when an electric field is applied to the device through a pair of low-resistance contacts, the active region of the device is isolated from the controlling electric fields at the contacts. When the controlling nature of the contacts is eliminated, a new type of oscillation hitherto unobserved, and a novel class of oscillators results.

2. Description of the Prior Art

High-frequency current oscillations in N-type polar semiconductors such as gallium arsenide at high electric fields were first observed by J. B. Gunn in 1963. In the Gunn effect, semiconductor crystals become unstable when subjected to high electric fields above a threshold value, and this instability is in the form of narrow domains of very high electric field (shock waves) which propagate uniformly through the semiconductor. The instability is observed as a fluctuation of the current when a constant voltage is applied between two "ohmic" contacts attached to the crystal. The operation of Gunn-type devices is well known.

U.S. Pat. No. 3,414,841 a mode of operation for two-valley semiconductors sometimes called the LSA mode. In these devices a resonant circuit is connected to the semiconductor through "ohmic" contacts, and the resonant circuit is adjusted to vary the electric field intensity within the semiconductor to prevent formation of traveling domains while still obtaining sustained oscillations.

In copending application Ser. No. 797,218 entitled "Active Solid State Devices Having Non-Linear Contacts," filed on even date herewith by P. R. Solomon and M. P. Shaw and now abandoned there is disclosed a class of active solid state oscillators in which nonlinear contacts such as back-to-back diodes are contacted to a working substance comprising a semiconductor crystal. In the copending application, various modes of operation are described which depend entirely upon the nature of the contacts applied to the semiconductor working substance. In all forms of the invention disclosed in the copending application, the electric field resulting from a DC bias voltage at the boundary between the contact at the cathode the semiconductor working substance (when N-type material is used) is higher than the electric field in the bulk of the semiconductor working substance. This results in one distinct mode of operation by virtue of the formation of traveling domains similar to Gunn oscillation. In another mode, transit time oscillations are produced by virtue of the propagation of a depletion layer from the working substance contact boundary into the bulk of the semiconductor working substance. In a third mode of the invention, the difference between the high electric field appearing at the boundary between the contact and the semiconductor working substance, and the low electric field in the two-valley semiconductor bulk, results in an instability at the resonant frequency when the device is incorporated into a resonant circuit.

This invention describes a class of oscillators and amplifiers which can be constructed by eliminating the controlling nature of the contacts. Low resistance contacts, linear or nonlinear, are attached to a semiconductor working substance in which the bulk of the semiconductor is shaped in such a way as to keep the active region of the material away from the controlling fields of the contacts. The electric field in the active region of the material higher than the electric field at the active-inactive region interface. When the device is incorporated into a resonant circuit, current oscillations at the resonant frequency occur. Various embodiments of the invention are described.

In another form of this invention, Gunn-type oscillations involving traveling domains may be generated in the shaped oscillators by changing the electric field configuration inside the active region of the semiconductor working substance such that the electric field at the active-inactive region interface is greater than the electric field within the active region of the working substance.

SUMMARY OF THE INVENTION

A primary object of the present invention is to provide a class of active solid state oscillators and amplifiers in which a working substance such as a semiconductor crystal is connected between two low-resistance contacts, and in which the active region of the semiconductor working substance is shaped so as to be unaffected by the high electric field at the junction between the active material and the contacts.

In accordance with the present invention, there is disclosed a series of novel oscillator devices in which a bulk or epitaxially grown two-valley semiconductor is shaped such that the active region has a smaller bulk or cross-sectional area than the portion of the semiconductor working substance adjacent the controlling contact. For N-type semiconductor material, the controlling contact is the cathode; for P-type material, the controlling contact is the anode.

Low-resistance contacts are applied at the anode and the cathode of the semiconductor working substance. The contacts may have a current voltage relationship which is linear or nonlinear.

When a DC voltage is applied between the anode and cathode contacts, an electric field is formed in the active portion of the semiconductor material which is higher than the electric field at the junction of the active and inactive regions.

When the device is placed in a resonant external circuit, and the electric field is increased until the electric field in the active region is increased until the electric field in the active region of the semiconductor working substance reaches a threshold value, instability occurs and current oscillations are produced at the resonant frequency of the external circuit.

Another object of this invention to provide a class of active solid state oscillators and amplifiers in which transit time oscillations occur by virtue of the formation of domains which are propagated across the bulk of the semiconductor working substance. The transit time oscillations are similar to those produced by Gunn-type devices.

In accordance with this embodiment of the invention, the shaped or sculptured contact-semiconductor working material contact devices are slightly modified, for example by physically notching the active portion of the semiconductor working substance near the boundary of the controlling contact, or by varying the shape or doping profile of the active region of the semiconductor working substance, to cause the electric field in the region of the active-inactive region interface to be greater than the electric field within the active portion of the semiconductor working substance. When a DC electric field is applied to the device, a threshold value is reached at which domains are formed at the active-inactive region interface and transit time oscillations occur.

In accordance with other aspects of this invention, epitaxially grown semiconductor devices exhibiting the above characteristics are disclosed. Further, compound or parallel shaped oscillators are also disclosed.

DESCRIPTION OF THE PREFERRED EMBODIMENT

Figure 1:
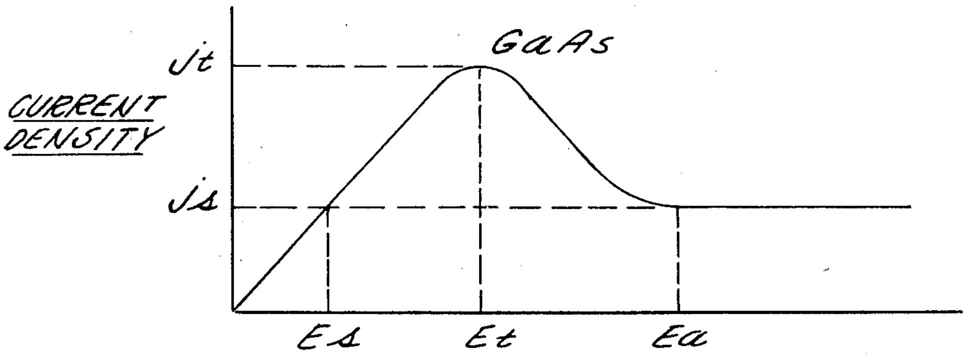
FIG. 1 shows a plot of current density versus electric field in a GaAs semiconductor.

Referring to FIG. 1 there is shown a curve of conduction current density $j$ versus electric field E for a two-valley semiconductor such as gallium arsenide. Conduction current density $j$ is equal to the product of the carrier density $n$, the carrier charge $e$, and the carrier velocity $v$. For N-type materials the carrier velocity $v$ refers to the electron velocity across the semiconductor crystal. For P-type materials the carrier velocity refers to hole velocity.

As is seen by the shape of the curve in FIG. 1, the current density through the semiconductor working substance increases substantially linearly as an increasing electric field is applied until a threshold electric field, $E_t$, is reached at which time the current density is $j_t$. At this time the current density decreases and eventually levels off at a value $j_s$ less than $j_t$. The electric field $E_a$ is the electric field above the threshold $E_t$ at which the rate of change of the current density with respect to the electric field becomes zero or first becomes less than a suitably small value. The slope of the curve between the values $E_t$ and $E_a$ is negative and defines the region of differential negative conductivity or the negative resistance region.

It is noted that for current densities of $j_s$, the semiconductor crystal can support an electric field E equal to $E_s$, and also any field above $E_a$. The field $E_s$ is thus defined as the low field corresponding to a current density of $j_s$ as determined by the high field characteristics.

Since the curve of FIG. 1 is representative of all samples of gallium arsenide and similar two-valley semiconductors, the precise shape of the curve may vary somewhat depending upon the doping level, impurities, mobilities, etc. of a particular sample. Furthermore, at electric fields above $E_a$ it is immaterial whether the curve of FIG. 1 remains constant, increases or decreases.

Figure 2:
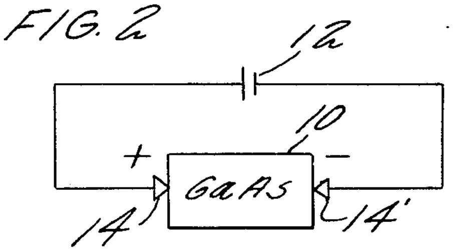
FIG. 2 shows schematically one electrical configuration of this invention using diode contacts.
Figure 3:
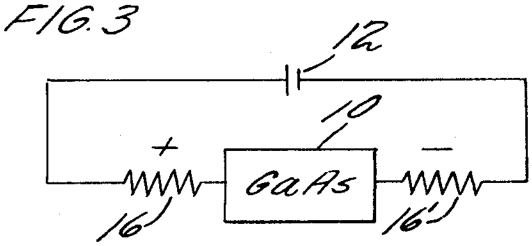
FIG. 3 shows schematically another electrical configuration of this invention using resistive contacts.

FIGS. 2 and 3 show schematically the physical structure of this invention. A working substance such as a semiconductor crystal of gallium arsenide 10 is positioned in a circuit powered by a DC voltage source 12. An AC or pulsed DC voltage source may also be used. Contacts are applied on either side of the semiconductor working substance. In FIG. 2 the contacts are shown as diodes 14 and 14', and in FIG. 3 the contacts are shown as resistors 16 and 16'.

FIGS. 2 and 3 illustrate that the contacts applied to the semiconductor working substance may be either linear or "ohmic" contacts as shown by resistors 16 and 16' of FIG. 3, or nonlinear diode-type contacts as shown by diodes 14 and 14' of FIG. 2. The methods for applying contacts are well known to those skilled in the art and will not be described in detail. However, reference may be had to copending application Ser. No. 797,218 which describes various methods for applying diode contacts of differing characteristics.

As described previously, for N-type material the controlling contact will be that at the cathode which is the negative electrode as shown in FIGS. 2 and 3. Throughout this specification the various embodiments will be described in terms on N-type semiconductor material, and the controlling contact will be that at the cathode. It is recognized that for P-type material the anode will be the controlling contact.

Figure 4:
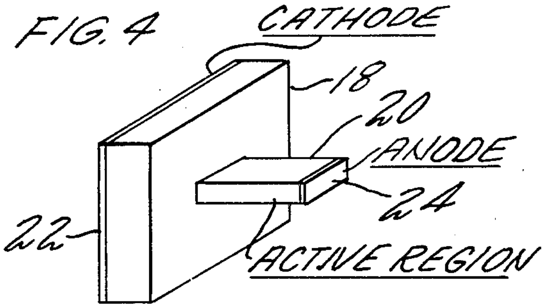
FIG. 4 shows a preferred embodiment of this invention.
Figure 5:
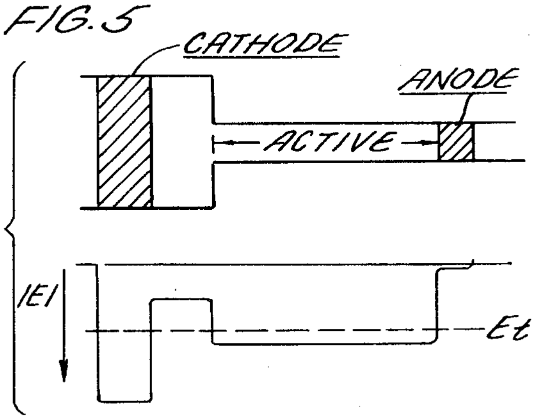
FIG. 5 shows the electric field distribution in the embodiment of FIG. 4.

FIG. 4 shows a preferred embodiment of this invention. The semiconductor working substance 18 is fashioned in a manner to alter the electric field distribution in the bulk of the semiconductor working substance. Part of the semiconductor working substance is either sawed, eroded, ground, etched or otherwise removed to form the shape shown in which the active region 20 of the semiconductor working substance is physically smaller in cross section than the remainder of the working substance. A cathode contact 22 and an anode contact 24 are attached to the working substance as shown. When a DC voltage source is applied to the anode and cathode contacts, the electric field distribution in the entire assembly will be as shown in FIG. 5. Assuming that the cathode contact is a diode as in FIG. 2, the electric field E which occurs at the diode is quite large. In the large region of working substance 18 adjacent the cathode diode, the electric field is much smaller. In the active region 20 of the working substance the electric field again increases to a value at least above the threshold electric field $E_t$. The anode diode, being forward biased, has a very low impedance and the electric field there is very low.

The theory of operation of the device of FIG. 4 is as follows. It has been shown that the Gunn effect requires some sort of nucleation site such as a variation in doping, a notch physically cut in the active region of the material, or a high field junction cathode. When Gunn-type domain nucleation sites are removed, the device will not shown Gunn domains. Both experimentation and computer simulation shown this result. A computer simulation shows that when the domain nucleation sites are eliminated, new kinds of oscillations occur. The oscillations can occur in two regimes of operation. In regime I, a high electric field region exists at the anode which is unstable in a resonant circuit. In regime II, oscillations of the field occur uniformly throughout the sample when the device is placed in a high-frequency resonant circuit. In both regimes the devices makes use of the different modes of oscillation to produce AC power.

Figure 6:
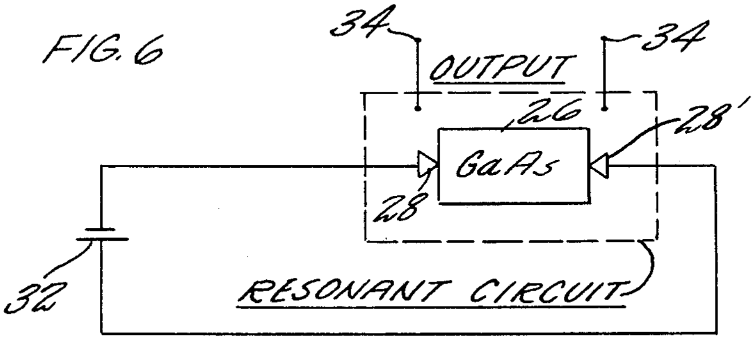
FIG. 6 shows schematically an embodiment of this invention in an electrical load circuit.

When the entire assembly is placed in a resonant external circuit as shown in FIG. 6, current oscillations are produced for both regimes I and II. In FIG. 6 the gallium arsenide crystal 26 has two contacts 28 and 28' applied thereto, the contacts being shown as diodes. The device is incorporated into a resonant circuit 30. A DC voltage source such as battery 32 may be used to power the device, and the output is measured from electrodes 34. Pulsating DC or AC voltage may also be used.

When the device is incorporated into a resonant circuit, the oscillations described as regime I are produced. In a high-frequency resonant circuit, oscillations as described in regime II can occur. The electric field distribution of regime I can also in a high frequency resonant circuit but no oscillations will be produced when the device is placed into a resistive circuit.

The physical explanation of the configuration is that the active portion 20 of the working substance in FIG. 4 supports an electric field E which is near threshold $E_t$ while the electric field outside the active region is less than $E_t$. The active region is separated from the cathode at which a high electric field occurs. In other words, when the electric field in the active region is near $E_t$, the fields surrounding the active region are below $E_t$.

Figure 7:
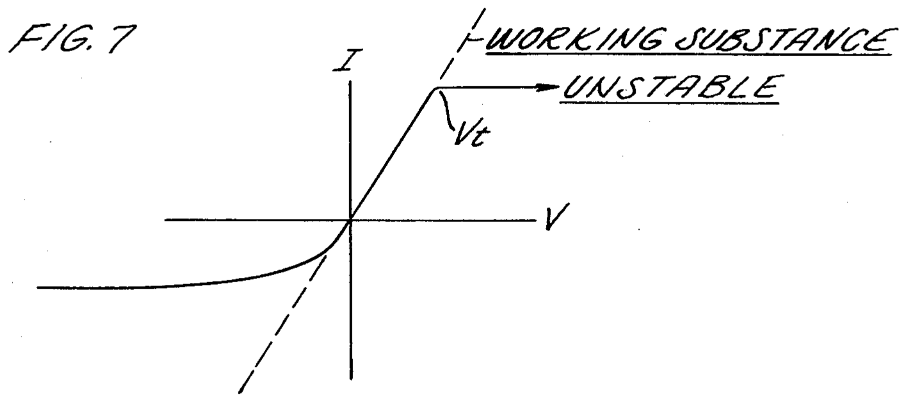
FIG. 7 shows the current versus voltage distribution in one configuration of this invention.
Figure 8:
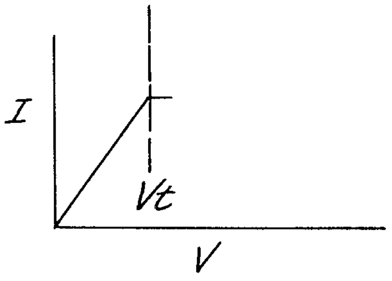
FIG. 8 shows the operation of this invention in a resistive circuit.
Figure 9:
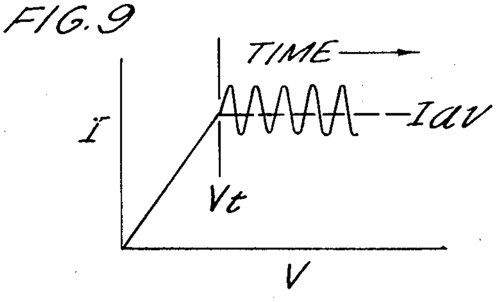
FIG. 9 shows the operation of this invention in a resonant circuit.

Typical current versus voltage characteristics for the device are shown in FIGS. 7, 8 and 9. FIG. 7 illustrates current versus voltage for the entire device of FIG. 4, that is, when the device is asymmetrical. When the device of FIG. 4 is placed into an external resistive network (not shown) and biased by a DC voltage source, an instability of the form of regime I occurs when a voltage $E_t$ is reached. This is shown in FIG. 8. This instability not of the type which occurs in Gunn oscillators, there is no current drop or periodic current fluctuations, and no electrical shock waves are produced. The current instability has an average current approximately equal to the current in the device at threshold, that is, when the instability occurs. The current saturation is caused by the formation of a high field at the anode.

When placed in a resonant external circuit as indicated in FIG. 6, current oscillations occur as depicted in FIG. 9. As stated previously, these oscillations are of high frequency when the resonant frequency of the circuit is high and regime I or II oscillations are produced. When the frequency of the resonant circuit is lower, low-frequency regime I oscillations are produced. Referring to FIG. 9, the current oscillations are shown on a time scale superimposed on the current versus voltage characteristics of the entire device. The current oscillations have an average value approximately equal to the current through the sample at threshold. These oscillations occur when the bias voltage V is such that a voltage $V_t$ is reached across the active portion of the device. The oscillations are coherent and are produced at the resonant frequency of the external circuit. This is true for both regime I and II operations.

For regime II, by probing measurements it has been determined that $V_t$ reached when the average electric field of the active region of the device is somewhere near, but slightly below, $E_t$ as defined in FIG. 1.

A computer simulation has been performed for an N-type gallium arsenide sample. The sample had a doping density of $10^{15}$/cm.$^3$, a length of $10^{12}$cm. and a cross-sectional area of $10^{13}$ cm.$^2$ The velocity versus electric field curve for N-type gallium arsenide was taken from the calculations of Butcher and Fawcett. Fluctuation in the doping density of the gallium arsenide were included in the computer simulation, the largest fluctuation being about 10 percent.

In the simulation, the fields at the cathode and anode were set to zero. The fields at other parts of the sample were computed. For a device capacitance of 9.8 $\times 10^{114}$ Farads and an inductance of $10^{19}$ $-10^{110}$ henrys, the device yielded tunable oscillations when incorporated into a resonant circuit. In the simulation the field across the entire sample was observed to move uniformly up and down at the resonant frequency. No propagating domains were observed. In a resistive circuit a high field formed at the anode and the current remained constant.

The oscillator of this invention need not take the precise form shown in FIG. 4, but may assume other shapes. However, in all embodiments it is necessary that the active region of the semiconductor working substance be properly shaped or doped such that the field E in the active region be greater than the threshold field $E_t$, while the field outside of the active region must be less than $E_t$.

Figures 10, 10A:
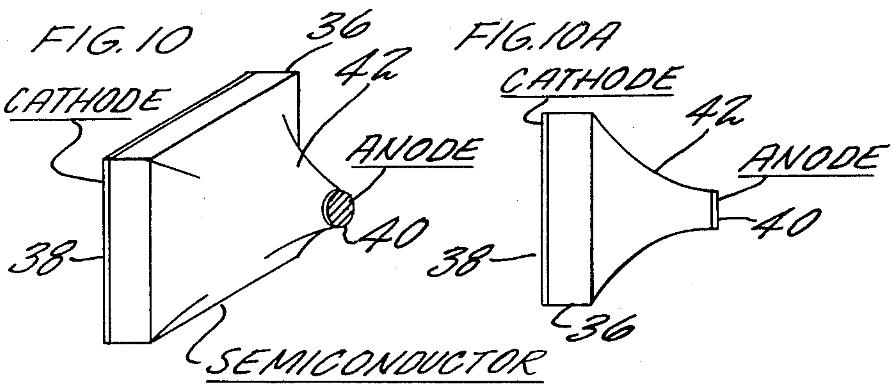
FIG. 10 shows another embodiment of this invention.
FIG. 10A shows the embodiment of FIG. 10 in cross section.

In FIGS. 10 and 10A there is shown an embodiment in which the large region of semiconductor working substance 36 adjacent the cathode 38 is sculptured in a smooth curve toward the smaller anode 40, thereby providing an active region 42 which decreases in cross-sectional area geometrically or exponentially from the cathode to anode contacts.

Figures 11, 11A:
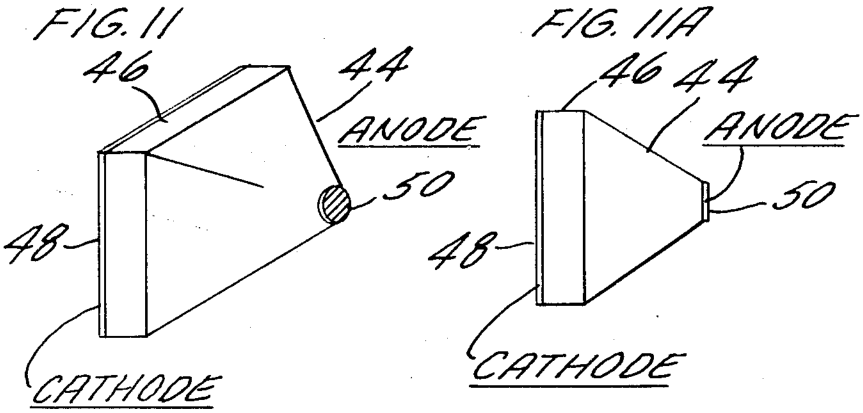
FIG. 11 shows another embodiment of this invention.
FIG. 11A shows the embodiment of FIG. 11 in cross section.

The FIGS. 11 and 11A embodiment show the active region 44 decreasing linearly from the larger bulk of semiconductor working substance 46 adjacent the cathode 48 to the small active region adjacent the anode 50.

Figures 12, 13, 14, 15, 16, 16A, 17, 18:
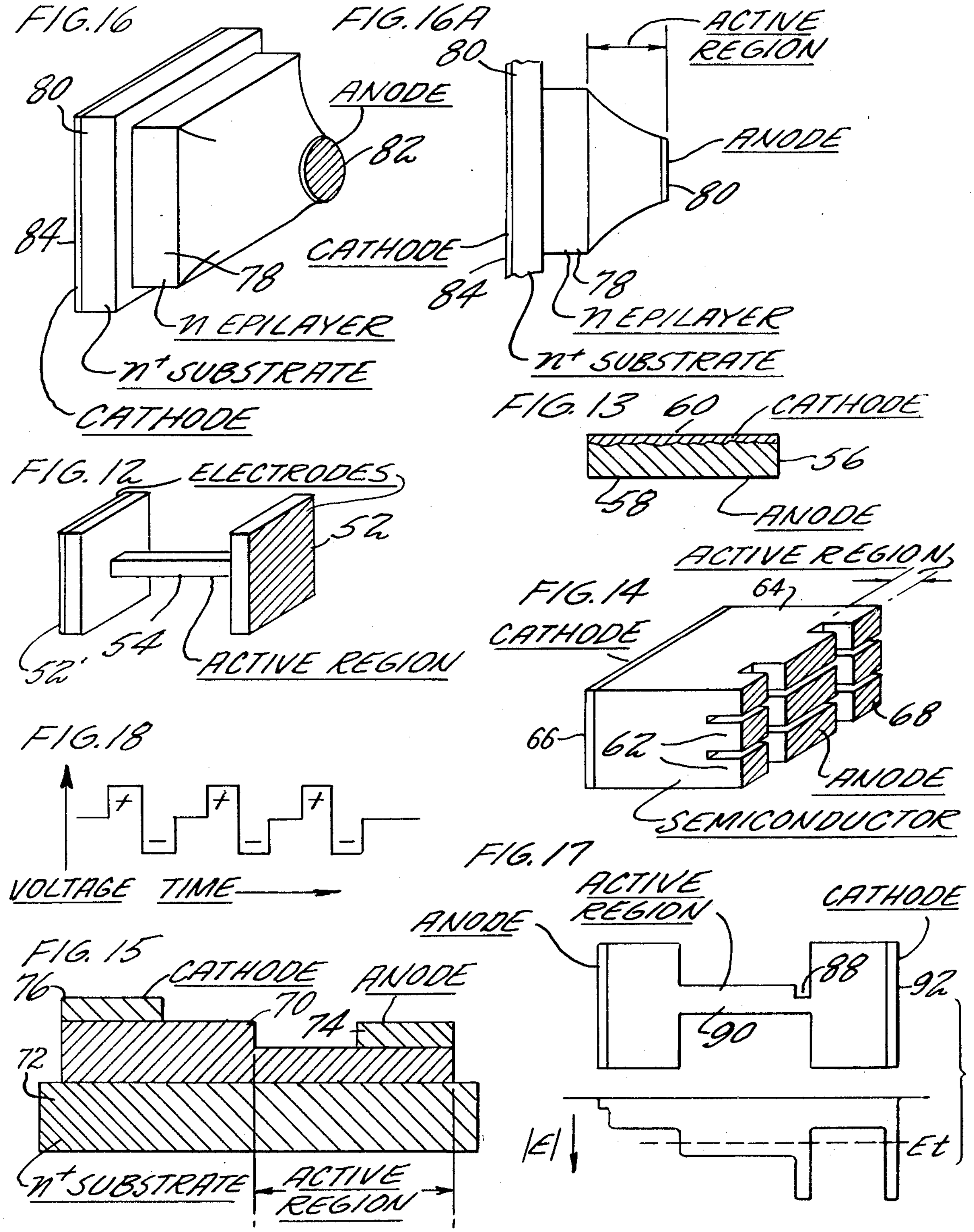
FIG. 12 shows a symmetrical embodiment of this invention.
FIG. 13 shows another embodiment of this invention.
FIG. 14 shows an embodiment of a plurality of devices of this invention in parallel.
FIG. 15 shows an epitaxial form of this invention.
FIG. 16 shows another epitaxial form of this invention.
FIG. 16A shows the embodiment of FIG. 16 in cross section.
FIG. 17 shows schematically a form of this invention which produces transit time oscillations.
FIG. 18 shows an input voltage wave form for the device of FIG. 17.

FIG. 12 shows a symmetrical device in the form of a dumbbell. The semiconductor working substance adjacent each electrode 52 and 52′ is much larger than the narrow active region 54 between the two electrodes. Since this device is symmetrical, it will operate in the same manner regardless of the direction in which the DC voltage source is applied across the two electrodes.

FIG. 13 shows in cross section an embodiment in which the semiconductor working substance 56 takes the form of a flat crystal with one side of the crystal being polished smooth whereas the other side is quite rough or contoured. The anode contact 58 is applied on the smooth surface, and the cathode contact 60 is applied on the roughened or contoured surface. It may be seen that the area of the semiconductor working substance in contact with the cathode contact is greater than the portion of semiconductor working substance in contact with the anode.

FIG. 14 illustrates schematically a method for providing a plurality of active devices in parallel. In this embodiment the anode side of the semiconductor working substance is cut in both horizontal and vertical directions to produce a plurality of devices 62 each in cross-sectional area much smaller than the bulk of the working substance 64 adjacent the cathode electrode 66. The cathode contact is applied to the uncut side of the semiconductor working substance 64, while a plurality of anode contacts 68 are made on the side of the semiconductor working substance which has been cut. Each anode operates independently to form an entire oscillator device.

FIG. 15 shows another embodiment of this invention in which an $n$-epilayer 70 is deposited upon an $n^+$ substrate region 72. The deposition is in the shape of a step in which one side of the $n$-epilayer is higher than the other side. The anode contact 74 is applied to the lower region, while the cathode contact 76 is applied to the higher region. In this manner the cross-sectional area and bulk of the semiconductor $n$-epilayer adjacent the anode is smaller than that adjacent the cathode, and the desired electric field configuration is produced.

FIGS. 16 and 16A show an alternate embodiment in which the $n$-epilayer 78 is deposited on the $n^+$ substrate 80 in a contoured fashion. The anode contact 82 is applied to the smaller cross-sectional area of the $n$-epilayer, while the cathode contact 84 is applied to the $n^+$ substrate. Again in this embodiment the active region 86 is contoured such that the electric field in the active region will be larger than the electric field in the region immediately adjacent the active region, while the electric field will again be larger at the cathode.

Other configurations and other methods of producing the electric field distributions necessary for operation of these devices will be apparent to those skilled in the art. For example, precise doping control may be used to control field distribution.

All of the devices described above may be modified slightly to operate as Gunn-type oscillators by slightly changing their shape, doping profile or other characteristics as will be described. In FIG. 17 there is shown the dumbbell-type configuration similar to FIG. 12 in which a physical notch 88 is cut out from the active region 90 of the semiconductor working substance on the side of the active region toward the cathode 92. The presence of the notch changes the field configuration inside the device so that the electric field on the cathode side of the active region is greater than threshold $E_t$. In other words the field configuration at the boundary between the active region and the controlling cathode connection are such that the electric field E outside the active region on the cathode side is greater than the electric field E within the active region. When this occurs domains will be formed at the boundary of the active region of the cathode side, and propagate down the active material toward the anode. When this device is placed in a resistive circuit, oscillations occur at the transit time of the traveling domains.

When the device of FIG. 17 is placed in a resonant circuit and driven in a pulsed mode with a pulse train as shown in FIG. 18, the device will display the natural transit time frequency oscillations described by Gunn during the negative portion of the pulse, and the normal resonant circuit frequency oscillations of the device shown in FIG. 12 during the time when the positive portion of the pulse of FIG. 18 is applied.

This device may be used in many different ways depending on the absolute amplitude of the positive and negative excursions of the pulse, their relative amplitudes, and the threshold voltages of the instabilities.

It is important for all the devices described that the electric fields at the controlling contact should not be in a range which is deleterious to the operation of the device. Thus, for example, the fields at the controlling contact should be either below threshold $E_t$, or above $E_a$ when the threshold value is reached in the active region.

All the devices are very sensitive to variations in cross section along or near the active region. Irregular variations may give rise to high electric fields which may cause spurious phenomena such as random nucleation of Gunn effect domains. Thus the lateral surfaces should be as smooth as possible and care should be taken to insure uniformity.

Gross doping fluctuations in the semiconductor working substance can also give rise to domain nucleation sites and spurious Gunn oscillations. Thus the homogeneity of the device must be controlled. Methods for doing this are readily apparent to those skilled in the art.

Current oscillations have been produced in the sculptured devices disclosed on a pulsed basis over the range from 60 mHz. to 8.2 gHz. with as high as 0.6 watts peak power at 8.2 gHz. This is the only range investigated at this time, but it is expected that the frequency range can be extended, possibly as high as intervalley relaxation times. Conversion to *cw* operation requires only the proper heat sinking.

Although the invention has been shown and described with respect to particularly preferred and advantageous embodiments, it should be understood by those skilled in the art that various changes and omissions in the form and detail may be made therein without departing from the spirit and the scope of the invention.

We claim:

1. In a semiconductor device which includes an N-type two-valley semiconductor material capable of exhibiting bulk negative differential resistance,
   anode and cathode contacts connected to different portions of said material, said contacts being of low resistance and being separated by an active region of said material,
   a load circuit connected with said material,
   and means for applying a bias voltage between said contacts of a magnitude sufficient to generate an electric field above a threshold value at which said material begins to exhibit differential negative resistance,
   the improvement which comprises means for maintaining the electric field at the cathode boundary of the active region of said material at a magnitude which is below said threshold value while the electric field in the active region of said material is above said threshold value whereby no current oscillations are produced in said material when said load circuit is resistive, and whereby circuit controlled current oscillations are produced in said material at a frequency determined by the load circuit when said load circuit is a resonant circuit.

2. A semiconductor device as in claim 1 in which the active region of said semiconductor material is physically separated from the said cathode contact by a nonactive region of said semiconductor material having a larger cross-sectional area than the cross-sectional area of the said active region.

3. A semiconductor device as in claim 1 in which said semiconductor material is GaAs.

4. A semiconductor device as in claim 1 in which at least one of said contacts has a linear current versus voltage characteristic.

5. A semiconductor device as in claim 1 in which at least one of said contacts has nonlinear current versus voltage characteristics.

6. A semiconductor device as in claim 30 in which said nonlinear contact is a diode.

7. A semiconductor device as in claim 1 in which said active region has a substantially constant cross-sectional area along the length thereof.

8. A semiconductor device as in claim 2 in which said anode contact is applied to the active region of said semiconductor material.

9. A semiconductor device as in claim 8 in which said active region has a cross-sectional area which decreases substantially linearly from the nonactive region of said semiconductor material toward said anode contact.

10. A semiconductor device as in claim 8 in which said active region has a cross-sectional area which varies in a predetermined geometrical pattern between the nonactive region of said semiconductor material and said anode contact.

11. A semiconductor device as in claim 2 in which the active region of said semiconductor material physically separated from the said anode contact by a nonactive region of said semiconductor material having a larger cross-sectional area than the cross-sectional area of the said active region.

12. A semiconductor device as in claim 1 in which said semiconductor material consists of an epilayer formed upon a substrate.

13. A semiconductor device as in claim 12 in which said contacts are connected to said epilayer.

PO-1050
(5/69)

UNITED STATES PATENT OFFICE
CERTIFICATE OF CORRECTION

Patent No. 3,601,713 Dated August 24, 1971

Inventor(s) Peter R. Solomon, Melvin P. Shaw and Harold L. Grubin

It is certified that error appears in the above-identified patent and that said Letters Patent are hereby corrected as shown below:

Claim 6, column, 8, line 22, "30" should read -- 5 --.

Signed and sealed this 4th day of January 1972.

(SEAL)
Attest:

EDWARD M.FLETCHER,JR.
Attesting Officer

ROBERT GOTTSCHALK
Acting Commissioner of Patents

PO-1050
(5/69)

UNITED STATES PATENT OFFICE
CERTIFICATE OF CORRECTION

Patent No. 3,601,713 Dated August 24, 1971

Inventor(s) Peter R. Solomon, Melvin P. Shaw and Harold L. Grubin

It is certified that error appears in the above-identified patent and that said Letters Patent are hereby corrected as shown below:

Column 5, line 37, "$10^{12}$cm" should read -- $10^{-2}$cm --

Column 5, line 38, "$10^{13}$cm.$^2$" should read -- $10^{-3}$cm.$^2$ --

Column 5, line 45, "9.8 x $10^{114}$" should read

-- 9.8 x $10^{-14}$ --

Column 5, line 46, "$10^{19}$ - $10^{110}$" should read

-- $10^{-9}$ - $10^{-10}$ --

Signed and sealed this 11th day of June 1974.

(SEAL)
Attest:

EDWARD M.FLETCHER,JR.
Attesting Officer

C. MARSHALL DANN
Commissioner of Patnets